United States Patent
Bennett

(10) Patent No.: US 6,297,669 B1
(45) Date of Patent: Oct. 2, 2001

(54) LOW-TECHNOLOGY INEXPENSIVE LOGIC MODULE SYSTEM

(76) Inventor: William S. Bennett, 7 Cherry La., Binghamton, NY (US) 13901

( * ) Notice: Subject to any disclaimer, the term of this patent is extended or adjusted under 35 U.S.C. 154(b) by 0 days.

(21) Appl. No.: 09/610,117

(22) Filed: Jun. 30, 2000

(51) Int. Cl.$^7$ ............................................. H03K 19/086
(52) U.S. Cl. ............................ 326/112; 326/114; 326/136
(58) Field of Search .................................. 326/125, 114, 326/37, 47, 136

(56) References Cited

U.S. PATENT DOCUMENTS 3,890,512 * 6/1975 Kumakawa et al. ............... 307/203
6,202,194 * 3/2001 Seningen et al. .................. 716/10
6,211,456 * 4/2001 Seningen et al. .................. 174/27

* cited by examiner

Primary Examiner—Michael Tokar
Assistant Examiner—Anh Tran
(74) Attorney, Agent, or Firm—Douglas M. Clarkson

(57) ABSTRACT

A system of logic modules providing AND, OR and NOT logical elements most useful in education and entertainment situations where it is important to avoid excessive costs and where speed is not a requirement utilizes electrical continuity and a lack of electrical continuity between pairs of electrical conductors to represent predetermined values of logical variables.

15 Claims, 3 Drawing Sheets ized. Generally, it is either present or not; there is
LOW-TECHNOLOGY INEXPENSIVE LOGIC MODULE SYSTEM

BACKGROUND OF THE INVENTION

1. Field of the Invention

The present invention, generally, relates to logic modules and, more particularly, to new and improved circuits that can accomplish the logical AND, OR and NOT functions. These circuits can be combined in networks and even to logic modules that can be arranged in an unusually economical way, making them ideal for use at low speeds in education and entertainment. Also, these modules reduce heat dissipation in certain high-speed networks.

2. Description of Related Art

Computers and digital control systems are constructed from logic modules to accomplish AND, OR, and NOT logical functions. It is desirable to have a set of inexpensive AND, OR, and NOT modules that can be plugged together in various combinations, the output of each module typically feeding into the input of another module, until the output of the last module can be sensed or drive a circuit to energize a lamp, a motor or some other device.

However, logic modules available today are high-technology, with transistors in integrated circuit chips, affixed to printed circuit cards. The present invention, therefore, makes possible a system of logic modules in which the elements can:

(a) be built from electrical conductors only;

(b) be cascaded to produce logic networks;

(c) be driven by contact closures; and (d) be sensed at the end of the network.

A U.S. Pat. No. 3,410,001 to Blum dated Nov. 12, 1968, describes a digital logic circuit with connections to a visual display for training students.

A U.S. Pat. No. 3,934,231 to Armstrong dated Jan. 20, 1976, describes a digital logic circuit with connections in a generally tree-like arrangement useful for boolean functions of variables.

A U.S. Pat. No. 4,517,474 to Shepter dated May 14, 1985, describes a logic system of transitions of a two-level binary signal to provide a logic function.

A U.S Pat. No. 5,868,575 to Kuczewski dated Feb. 9, 1999, describes an interactive logic instructional system for teaching students linked by cooperative logic connections.

OBJECTS AND BRIEF SUMMARY OF THE INVENTION

It is a principal object of the present invention to provide a logic module which is very low-technology and very low-cost for both small and large numbers of modules.

It is also an object of the present invention to provide a logic module of electrical conductors without relays, transistors, or other active elements.

It is a further object of the present invention to provide a logic module for use in toys, education, or any other use to avoid the cost of support equipment for semiconductor devices.

Briefly, in a logic module that is constructed and arranged according to the present invention, each variable is represented by patterns of electrical conductors alone. A number of logic modules can be interconnected to form a network for performing a desired purpose. The output of the last module in such a network is sensed by an electrical continuity tester to reveal the state of the output logical variable from that module.

BRIEF DESCRIPTION OF THE DRAWINGS

A complete understanding of the present invention and its background may be obtained by reference to the accompanying drawings, when considered in conjunction with the subsequent detailed description, in which.

DESCRIPTION OF THE PRESENTLY PREFERRED EMBODIMENT

To be able to achieve the AND, OR, and NOT functions with electrical conductors alone, the present invention abandons the usual electrical representation of logical variables. Instead of logical variables being represented by an electrical voltage, each variable is represented by a pattern of electrical "continuity".

The differences involved in adopting "continuity" in this representation of logical variables are explained at the beginning of this description in order to avoid a misunderstanding and to ensure clarity of the present invention. For example, continuity is not to be measured or otherwise quantisized. Generally, it is either present or not; there is either electrical continuity or there is a lack of electrical continuity.

However, being more specific, the present invention is useful in a situation where the resistance of connecting conductors is very low compared to the resistance of a load. Even though there may be a measurable resistance present, "continuity" is present as defined by the present invention.

Therefore, according to the present invention, continuity is a factor to be determined; not measured. Accordingly, presence or lack of presence of continuity, while involving or requiring an electrical voltage, does not need a voltage of any particular size or magnitude.

In the following description, it is important to understand the difference between a logical variable and the value of that logical variable. A logical variable, as used in the following description, is an input to, or an output of, one of the three logical functions AND, OR and NOT. A logical variable can have one of two values, such as TRUE or FALSE, for example.

Figure 1:
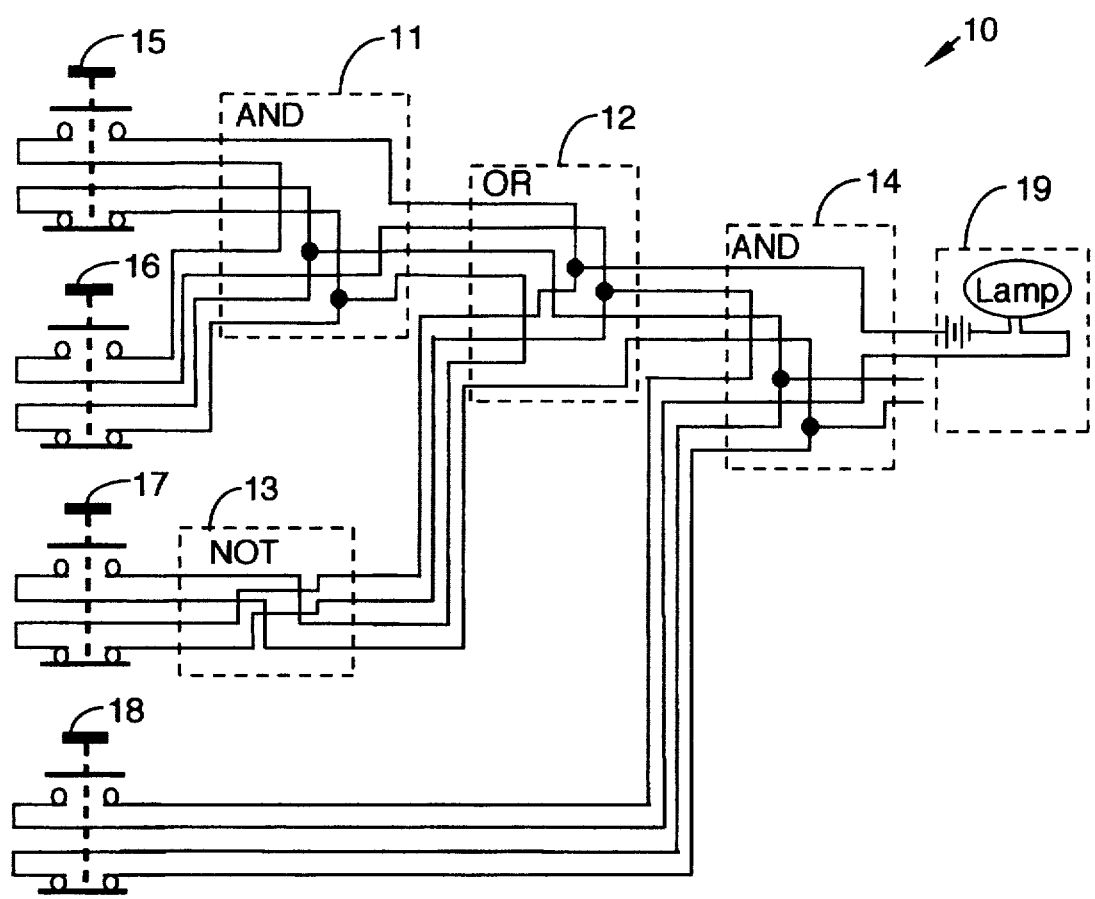
FIG. 1 illustrates a schematic view of a network of logical modules, switches, and continuity sensor.

Now, refer to FIG. 1 of the drawings, a network 10 of logic modules 11, 12, 13 and 14 is shown with switches 15, 16, 17 and 18 and an output continuity sensor 19 (or circuit to perform a task). The switches 15 and 16 form the inputs to the AND logic module 11, and the switch 17 forms the input to the NOT logic module 13.

The output of the AND logic module 11 and the output of the NOT logic module 13 form the inputs to the OR logic module 12. The output of the OR logic module 12 and the switch 18 form the inputs to the AND logic module 14.

The continuity sensor 19 tests the output of the AND logic module 14, indicating ON or OFF or TRUE or FALSE. The switches 15, 16, 17 and 18 can be in various combinations of states, and the current flow in the continuity sensor 19 determines whether continuity in the network is sensed.

Figure 2:
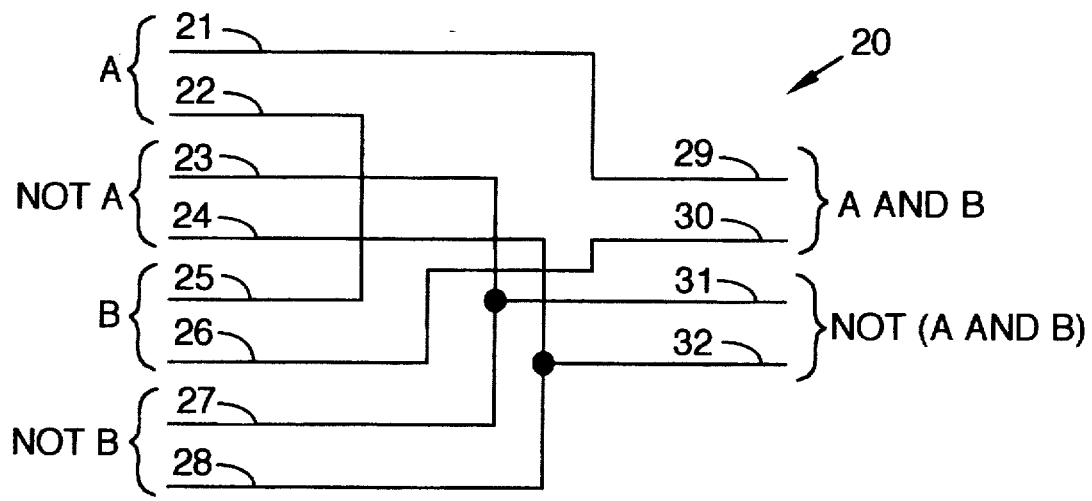
FIG. 2 is a schematic view of a circuit according to the present invention to implement an "AND" function.

Referring next to FIG. 2, a circuit 20 is shown to accomplish the function of an AND logic module using the system described above. Continuity between the conductors 21 and 22 represents a logical variable A, while continuity between conductors 23 and 24 represents a logical variable NOT A.

At the same time, continuity between the conductors 25 and 26 represents a logical variable B, while continuity between the conductors 27 and 28 represents logical variable NOT B. Clearly, there are no switches internal to this AND logic module of FIG. 2.

To implement the function of the AND logic module 20, a series circuit is traced from the conductor 29 back through the conductor 21, back through whatever series of modules and switches might connect the conductor 21 with the conductor 22, then down to conductor 25, back through whatever series of modules and switches might connect the conductor 25 with the conductor 26, then back to the conductor 30.

This establishes a logical variable (A AND B) between the conductors 29 and 30. The conductors 31 and 32, therefore, need to represent the logical variable NOT(A AND B).

By a logical theorem known as DeMorgan's Theorem,

NOT(A AND B)=NOT(A) OR NOT(B).

Consequently, to achieve the logical variable

NOT(A AND B), a parallel circuit is established to obtain the OR function on the negations of A and B.

A first parallel branch leads from conductor 31 back through conductor 23, back through whatever series of modules and switches might connect the conductor 23 with the conductor 24, and back to the conductor 32.

A second parallel branch leads from conductor 31, back through conductor 27, back through whatever series of modules and switches might connect the conductor 27 to the conductor 28, then back to the conductor 32.

Figure 3:
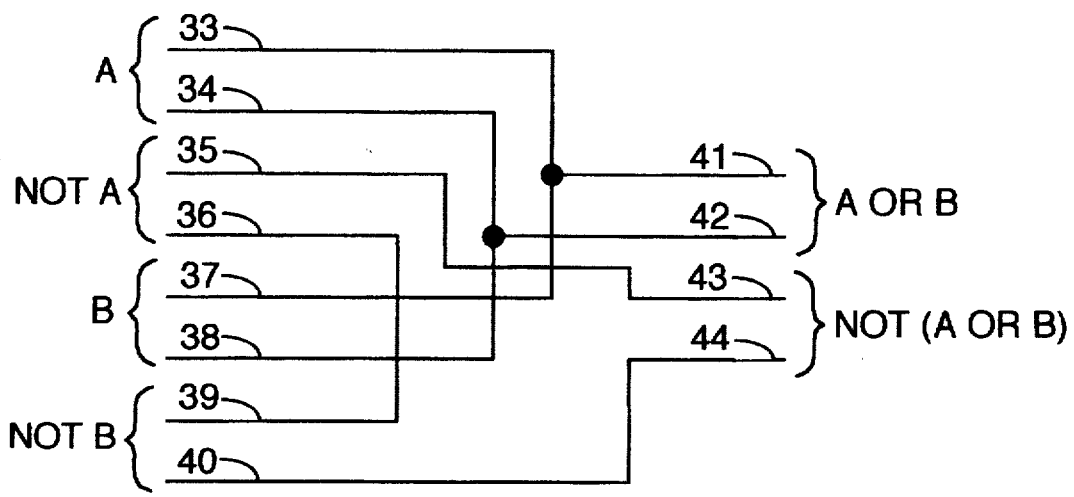
FIG. 3 is a schematic view of a circuit according to the present invention to implement an "OR" function.

FIG. 3 of the drawings shows a circuit to accomplish the OR function according to the present invention. Continuity between the conductors 33 and 34 represents logical variable A, while continuity between conductors 35 and 36 represents the logical variable NOT A.

At the same time, continuity between conductors 37 and 38 represents logical variable B while continuity between conductors 39 and 40 represents logical variable NOT B. A parallel circuit is established to obtain the OR function on A and B.

A first parallel branch leads from conductor 41 back through conductor 33, back through whatever series of modules and switches might connect the conductor 33 with conductor 34, and back to the conductor 42.

A second parallel branch leads from the conductor 41, back through the conductor 37, back through whatever series of modules and switches might connect the conductor 37 to conductor 38, then back to the conductor 42. This establishes a logical variable (A OR B)

between the conductors 41 and 42. The conductors 43 and 44, therefore, need to represent the logical variable

NOT(A OR B).

By the converse form of DeMorgan's Theorem,

NOT(A OR B)=NOT(A) AND NOT(B).

Consequently, to achieve the logical variable

NOT(A OR B), a series circuit is established to obtain the AND function on the negations of A and B.

This series circuit leads from the conductor 43 back through conductor 35, back through whatever series of modules and switches might connect the conductor 35 with the conductor 36, then down to conductor 39, back through whatever series of modules and switches might connect the conductor 39 with the conductor 40, then back to the conductor 44.

Figure 4:
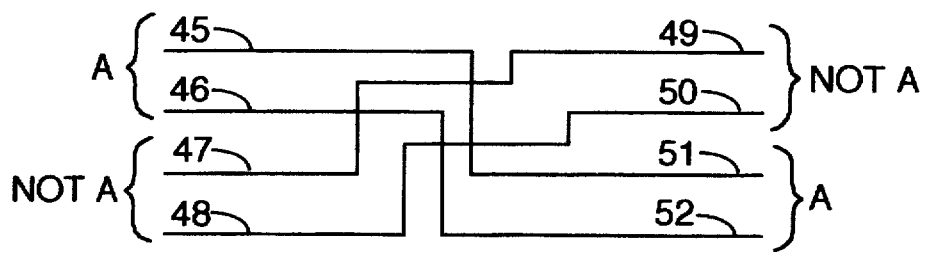
FIG. 4 is a schematic view of a circuit according to the present invention to implement a "NOT" function.

Refer now to FIG. 4, shown is a circuit to accomplish the NOT function. Continuity between conductors 45 and 46 represents the variable A.

To achieve the NOT function, this variable should appear between the conductors 51 and 52, so the conductor 45 is connected permanently to the conductor 51 and the conductor 46 is connected permanently to the conductor 52.

Similarly, the variable NOT A, which is represented by continuity between the conductors 47 and 48, will appear between the conductors 49 and 50. Also, the conductor 47 is connected permanently to the conductor 49, and the conductor 48 is connected permanently to the conductor 50.

Figure 5:
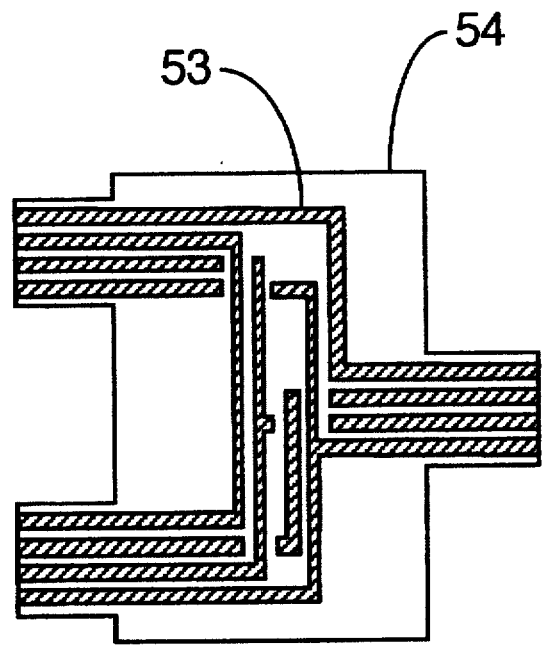
FIG. 5 illustrates a conductive pattern on an insulated panel utilized to fabricate a logical module in accordance with the present invention.
Figure 6:
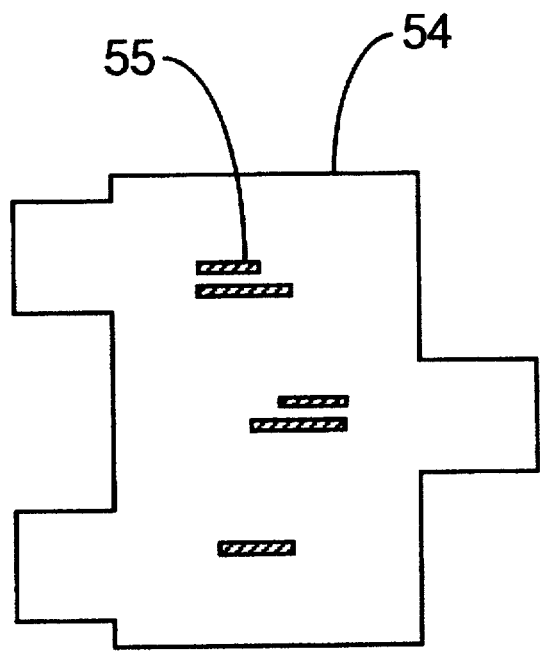
FIG. 6 illustrates a conductive pattern on an insulated panel utilized to fabricate a logical module in accordance with the present invention.

FIGS. 5 and 6 are examples of circuit patterns showing how the present invention is used to obtain the respective logic functions AND, OR and NOT.

A printed circuit, for example, is arranged in a pattern of conductors 53 on one insulated layer 54 and a second pattern of conductors 55 is arranged on the reverse side of the insulated layer 54. Where a conductor of a pattern on one side of the insulated layer 54 overlaps a conductor of a pattern on the other side to which it needs connecting, it is connected through vias as done in the field today.

Since various modifications, alterations and changes can be made to fit particular operating requirements and environments by those skilled in the art, the invention is not considered limited to the example chosen for the purposes of this description.

The present invention, therefore, is intended to be limited only be the spirit and scope of the appended claims.

What is claimed is:

1. A system of logic modules of only electrical conductors including a logical variable produced by the output of any logic module or any of a plurality of logical variables utilized as inputs by any logic module, said system comprising:

(a) a first, a second, a third, and a fourth electrical conductor;

(b) an electrical continuity between said first conductor and said second conductor and a lack of electrical continuity between said third conductor and said fourth conductor is a representation of a predetermined value of said logical variable; and (c) a lack of continuity between said first conductor and said second conductor and continuity between said third conductor and said fourth conductor being a representation of a value of said logical variable that is inverse from said predetermined value of said logical variable.

2. The system of logic modules in accordance with claim 1, wherein the output of any of said logic modules serves as any of a plurality of inputs to any other of said logic modules.

3. The system of logic modules of claim 1, further comprising a logic module representing a logical AND function, in which:
   (a) said first conductor of a first of a plurality of inputs is connected to said first conductor of an output;
   (b) said second conductor of each of a plurality of inputs is connected to said first conductor of the next of said plurality of inputs;
   (c) said second conductor of the last of said plurality of inputs is connected to said second conductor of said output;
   (d) said third conductor of each of said plurality of inputs is connected to said third conductor of each other of said plurality of inputs and to said third conductor of said output; and
   (e) said fourth conductor of each of said plurality of inputs is connected to said fourth conductor of each other of said plurality of inputs and to said fourth conductor of said output.

4. The system of logic modules of claim 1, further comprising a logic module representing a logical OR function, in which:
   (a) said first conductor of each of a plurality of inputs is connected to said first conductor of an output;
   (b) said second conductor of each of a plurality of inputs is connected to said second conductor of an output;
   (c) said third conductor of the first of a plurality of inputs is connected to said third conductor of said output;
   (d) said fourth conductor of each of a plurality of inputs is connected to said third conductor of the next of said plurality of inputs; and
   (e) said fourth conductor of the last of said plurality of inputs is connected to said fourth conductor of said output.

5. The system of logic modules of claim 1, further comprising a logic module representing a logical NOT function, in which:
   (a) said first conductor of an input is connected to said third conductor of an output;
   (b) said second conductor of said input is connected to said fourth conductor of said output;
   (c) said third conductor of said input is connected to said first conductor of said output; and
   (d) said fourth conductor of said input is connected to said second conductor of said output.

6. The system of logic modules of claim 1, further comprising a logic module representing a logical (A AND NOT B) function, in which:
   (a) said first conductor of a first input is connected to said first conductor of an output;
   (b) said second conductor of said first input is connected to said third conductor of a second input;
   (c) said third conductor of said first input is connected to said first conductor of said second input and to said third conductor of said output;
   (d) said fourth conductor of said first input is connected to said second conductor of said second input and to said fourth conductor of said output; and
   (e) said fourth conductor of said second input is connected to said second conductor of said output.

7. The system of logic modules of claim 1, further comprising a logic module representing a logical (A OR NOT B) function, in which:
   (a) said first conductor of a first input is connected to said third conductor of a second input and to said first conductor of an output;
   (b) said second conductor of said first input is connected to said fourth conductor of said second input and to said second conductor of said output;
   (c) said third conductor of said first input is connected to said third conductor of said output;
   (d) said fourth conductor of said first input is connected to said first conductor of said second input; and
   (e) said second conductor of said second input is connected to said fourth conductor of said output.

8. The system of logic modules of claim 1, further comprising a logic module representing a logical NOT (A AND B) function, otherwise known as a NAND function, in which:
   (a) said first conductor of a first of a plurality of inputs is connected to said third conductor of an output;
   (b) said second conductor of each of said plurality of inputs is connected to said first conductor of the next of said plurality of inputs;
   (e) said second conductor of the last of said plurality of inputs is connected to said fourth conductor of said output;
   (c) said third conductor of each of said plurality of inputs is connected to said third conductor of each other of said plurality of inputs and to said first conductor of said output; and
   (d) said fourth conductor of each of said plurality of inputs is connected to said fourth conductor of each other of said plurality of inputs and to said second conductor of said output.

9. The system of logic modules of claim 1, further comprising a logic module representing a logical NOT (A OR B) function, otherwise known as a NOR function, in which:
   (a) said first conductor of each of a plurality of inputs is connected to said first conductor of each other of said plurality of inputs and to said third conductor of an output;
   (b) said second conductor of each of said plurality of inputs is connected to said second conductor of each other of said plurality of inputs and to said fourth conductor of said output;
   (c) said third conductor of the first of said plurality of inputs is connected to said first conductor of said output;
   (d) said fourth conductor of each of said plurality of inputs is connected to said third conductor of the next of said plurality of inputs; and
   (e) said fourth conductor of the last of said plurality of inputs is connected to said second conductor of said output.

10. The system of logic modules of claim 1, further comprising an input device representing a TRUE input, in which:
    (a) said first conductor is connected to said second conductor;
    (b) said third conductor is left unconnected or is not present; and
    (c) said fourth conductor is left unconnected or is not present.

11. The system of logic modules of claim 1, further comprising an input device representing a FALSE input, in which:
    (a) said first conductor is left unconnected or is not present;

(b) said second conductor is left unconnected or is not present; and (c) said third conductor is connected to said fourth conductor.

12. The system of logic modules of claim 1, further comprising a switch which can provide an input to a logic module which can be either a TRUE input or a FALSE input;

(a) a TRUE input being generated when said first conductor of said switch is connected to said second conductor of said switch and said third conductor of said switch is disconnected from said fourth conductor of said switch; and (b) a FALSE input being generated when said first conductor of said switch is disconnected from said second conductor of said switch and said third conductor of said switch is connected to said fourth conductor of said switch.

13. The system of logic modules of claim 1, in which:

(a) each of said logic modules corresponds to a given logic module type such as an AND, an OR, or a NOT;

(b) each of said logic modules is formed of a series of conducting layers separated by interspersed insulating layers;

(c) each of said conducting layers is extended to form a plurality of contact pins located to contact a corresponding plurality of incoming conductors forming the inputs to the module, and outgoing conductors forming the outputs from the module; and (d) said contact pins on any one of said conducting layers being limited to those locations on said conducting layer which are adjacent to those of said incoming conductors or to those of said outgoing conductors requiring interconnection to form a logic module of a given said logic module type.

14. A system of logic modules utilizing electrical continuity in conductors to represent predetermined values of logical variables, said logic modules being logic circuits in which each logical variable produced by the output of a logic circuit or utilized as an input by a logic circuit is represented by said electrical continuity among four conductors, said system comprising:

(a) a logic module having a plurality of logical variable inputs and a single logical variable output, said logical variable output being a logical AND function of said logical variable inputs;

(b) a logic module having a plurality of logical variable inputs and a single logical variable output, said logical variable output being the logical OR function of said logical variable inputs;

(c) a logic module having a single logical variable input and a single logical variable output, said logical variable output being the logical NOT function of said logical variable input;

(d) means to create or remove electrical continuity among electrical conductors;

(e) sensing circuits able to detect electrical continuity; and (f) connections among said means to detect or remove electrical continuity, said logic modules, or said sensing circuits to indicate the state or value of a logical variable, said connections comprising (1) a first, a second, a third, and a fourth electrical conductor;

(2) electrical continuity between said first and second conductors and a lack of continuity between said third and fourth conductors representing a predetermined value of logical variable; and (3) a lack of continuity between said first and second conductor and continuity between said third and fourth being a representation of a value of said logical variable that is the logical negation of said predetermined value of said logical variable.

15. A system of logic modules in which the logical variable produced as the output of any logic module or any of a plurality of logical variables utilized as inputs by any logic module is represented by a representational system comprising:

(a) a first, second, third, and fourth electrical conductor; and (b) electrical continuity and a lack of electrical continuity between predetermined pairs of said electrical conductors representing predetermined values of said logical variable.

* * * * *